United States Patent
Young et al.

(10) Patent No.: US 8,668,815 B2
(45) Date of Patent: *Mar. 11, 2014

(54) PROCESS KIT FOR RF PHYSICAL VAPOR DEPOSITION

(75) Inventors: Donny Young, San Jose, CA (US); Lara Hawrylchak, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/457,438

(22) Filed: Apr. 26, 2012

(65) Prior Publication Data

US 2012/0205241 A1 Aug. 16, 2012

Related U.S. Application Data

(62) Division of application No. 12/433,315, filed on Apr. 30, 2009.

(60) Provisional application No. 61/050,112, filed on May 2, 2008.

(51) Int. Cl.
| | |
|---|---|
| *C25B 9/00* | (2006.01) |
| *C23C 14/00* | (2006.01) |
| *C25B 11/00* | (2006.01) |
| *C25B 13/00* | (2006.01) |
| *C23C 16/00* | (2006.01) |
| *B05C 11/11* | (2006.01) |

(52) U.S. Cl.
USPC ....... 204/298.11; 118/504; 118/715; 118/720

(58) Field of Classification Search
USPC ................... 118/715, 720, 504; 204/298.11
See application file for complete search history.

(56) References Cited

U.S. PATENT DOCUMENTS

| | | | | |
|---|---|---|---|---|
| 5,632,873 | A | * | 5/1997 | Stevens et al. ............ 204/298.15 |
| 5,690,795 | A | | 11/1997 | Rosenstein et al. |
| 5,697,427 | A | * | 12/1997 | Ngan et al. ................ 165/80.1 |

(Continued)

FOREIGN PATENT DOCUMENTS

| | | |
|---|---|---|
| JP | 10-072665 | 3/1998 |
| JP | 2001-140054 | 5/2001 |

(Continued)

OTHER PUBLICATIONS

PCT International Search Report and Written Opinion dated Nov. 30, 2009 for Application No. PCT/US2009/042387. (APPM/013028 PCT P).

(Continued)

*Primary Examiner* — Michael Band
(74) *Attorney, Agent, or Firm* — Patterson & Sheridan, LLP

(57) ABSTRACT

Embodiments of the invention generally relate to a process kit for a semiconductor processing chamber, and a semiconductor processing chamber having a kit. More specifically, embodiments described herein relate to a process kit including a cover ring, a shield, and an isolator for use in a physical deposition chamber. The components of the process kit work alone and in combination to significantly reduce particle generation and stray plasmas. In comparison with existing multiple part shields, which provide an extended RF return path contributing to RF harmonics causing stray plasma outside the process cavity, the components of the process kit reduce the RF return path thus providing improved plasma containment in the interior processing region.

10 Claims, 12 Drawing Sheets

(56) References Cited

U.S. PATENT DOCUMENTS

| | | | |
|---|---|---|---|
| 5,725,718 A * | 3/1998 | Banholzer et al. | 156/345.51 |
| 5,736,021 A | 4/1998 | Ding et al. | |
| 5,942,042 A | 8/1999 | Gogh | |
| 6,051,122 A * | 4/2000 | Flanigan | 204/298.11 |
| 6,059,945 A | 5/2000 | Fu et al. | |
| 6,296,747 B1 | 10/2001 | Tanaka | |
| 6,394,023 B1 | 5/2002 | Crocker | |
| 6,582,569 B1 | 6/2003 | Chiang et al. | |
| 6,589,352 B1 | 7/2003 | Yudovsky et al. | |
| 6,699,375 B1 | 3/2004 | Crocker | |
| 6,723,214 B2 | 4/2004 | Stimson et al. | |
| 6,730,174 B2 | 5/2004 | Liu et al. | |
| 6,743,340 B2 | 6/2004 | Fu | |
| 6,797,131 B2 | 9/2004 | Liu et al. | |
| 6,899,798 B2 | 5/2005 | Weldon et al. | |
| 7,041,200 B2 | 5/2006 | Le et al. | |
| 7,163,607 B2 | 1/2007 | Stimson et al. | |
| 7,294,245 B2 | 11/2007 | Fu | |
| 7,520,969 B2 | 4/2009 | Miller | |
| 7,981,262 B2 | 7/2011 | Pavloff et al. | |
| 8,062,487 B2 * | 11/2011 | Cheng et al. | 204/298.15 |
| 2002/0033329 A1 | 3/2002 | Wu | |
| 2002/0090464 A1 | 7/2002 | Jiang et al. | |
| 2004/0216998 A1 | 11/2004 | Fu | |
| 2005/0016684 A1 | 1/2005 | Sun et al. | |
| 2005/0199491 A1 | 9/2005 | Gung et al. | |
| 2007/0102286 A1 | 5/2007 | Scheible et al. | |
| 2007/0116872 A1 | 5/2007 | Li et al. | |
| 2007/0173059 A1 | 7/2007 | Young et al. | |
| 2008/0141942 A1 | 6/2008 | Brown et al. | |
| 2008/0178801 A1 | 7/2008 | Pavloff et al. | |
| 2009/0260982 A1 * | 10/2009 | Riker et al. | 204/298.11 |
| 2011/0036709 A1 * | 2/2011 | Hawrylchak et al. | 204/298.11 |
| 2011/0186426 A1 * | 8/2011 | Hawrylchak et al. | 204/298.11 |
| 2012/0103257 A1 * | 5/2012 | Rasheed et al. | 118/715 |
| 2013/0087452 A1 * | 4/2013 | Hawrylchak et al. | 204/298.11 |

FOREIGN PATENT DOCUMENTS

| | | |
|---|---|---|
| JP | 2007-146290 | 6/2007 |
| JP | 2008-522031 | 6/2008 |
| KR | 10-2000-0030996 | 6/2000 |
| WO | 2006/073585 | 7/2006 |

OTHER PUBLICATIONS

Office Action dated Jul. 30, 2013 for Japanese Patent Application No. 2011-507660. (APPM/013028 JAPA P).

* cited by examiner

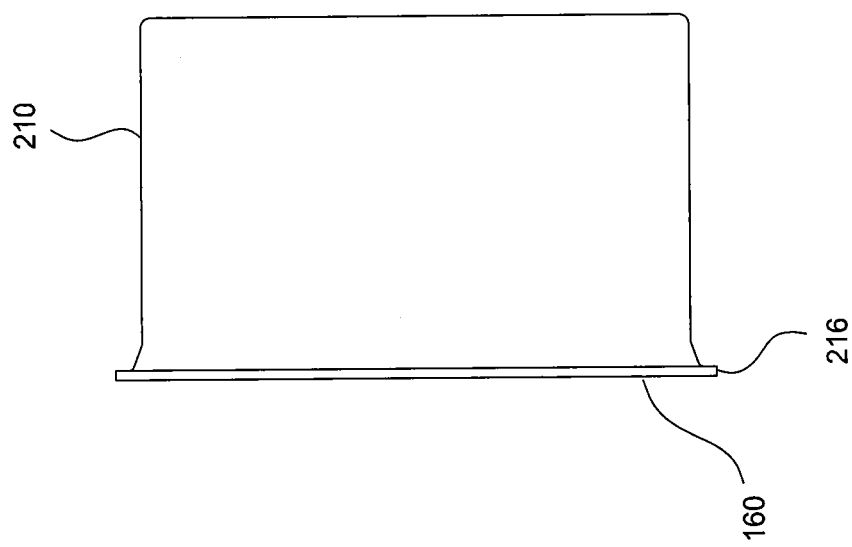

PROCESS KIT FOR RF PHYSICAL VAPOR DEPOSITION

CROSS-REFERENCE TO RELATED APPLICATIONS

This application is a divisional of co-pending U.S. patent application Ser. No. 12/433,315, filed Apr. 30, 2009, which claims benefit of U.S. Provisional Patent Application Ser. No. 61/050,112, filed May 2, 2008, all of which are hereby incorporated by reference in its entirety.

BACKGROUND OF THE INVENTION

1. Field of the Invention

Embodiments of the invention generally relate to a process kit for a semiconductor processing chamber, and a semiconductor processing chamber having a kit. More specifically, embodiments of the invention relate to a process kit including a cover ring, a shield, and isolator for use in a physical deposition chamber.

2. Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

A process kit may be disposed in the chamber to help define a processing region in a desired region within the chamber with respect to the substrate. The process kit typically includes a cover ring, a deposition ring, and a ground shield. Confining the plasma and the ejected atoms to the processing region helps maintain other components in the chamber free from deposited materials and promotes more efficient use of target materials, as a higher percentage of the ejected atoms are deposited on the substrate.

Although conventional ring and shield designs have a robust processing history, the reduction in critical dimensions brings increasing attention to contamination sources within the chamber. As the rings and shield periodically contact each other as the substrate support pedestal raises and lowers between transfer and process positions, conventional designs are potential source of particulate contamination. Further, existing shield designs often lack multiple grounding points and are often unable to provide the necessary electrical isolation to prevent arcing from RF source plasma.

The deposition ring additionally prevents deposition on the perimeter of the substrate support pedestal. The cover ring is generally used to create a labyrinth gap between the deposition ring and ground shield, thereby preventing deposition below the substrate. The cover ring also may be utilized to assist in controlling deposition at or below the substrate's edge. Thus, the inventors have realized that is would be advantageous to have a process kit that reduced stray plasma while also minimizing chamber contamination.

Therefore, there is a need in the art for an improved process kit.

SUMMARY OF THE INVENTION

Embodiments of the invention generally provide a process kit for use in a physical vapor deposition (PVD) chamber and a PVD chamber having an interleaving process kit. In one embodiment, the process kit includes an interleaving ground shield, cover ring, and isolator ring.

In one embodiment, a shield for encircling a sputtering surface of a sputtering target that faces a substrate support in a substrate processing chamber is provided. The shield comprises a cylindrical outer band having a first diameter sized to encircle the sputtering surface of the sputtering target. The cylindrical outer band has a top end sized to surround the sputtering surface and a bottom end sized to surround the substrate support. A sloped step having a second diameter greater than the first diameter extends radially outward from the top end of the cylindrical outer band. A mounting flange extends radially outward from the sloped step. A base plate extends radially inward from the bottom end of the cylindrical outer band. A cylindrical inner bad is coupled with the base plate and sized to encircle a peripheral edge of the substrate support.

In another embodiment, a cover ring for placement about a deposition ring in a substrate processing chamber is provided. The deposition ring is positioned between a substrate support and a cylindrical shield in the chamber. The cover ring comprises an annular wedge. The annular wedge comprises an inclined top surface encircling the substrate support, the inclined top surface having an inner periphery and an outer periphery. A footing extends downward from the inclined top surface to rest on the deposition ring. A projecting brim extends about the inner periphery of the top surface. An inner cylindrical band and an outer cylindrical band extend downward from the annular wedge, the inner band having a smaller height than the outer band.

In yet another embodiment, an isolator ring for placement between a target and a ground shield is provided. The isolator ring comprises an annular band sized to extend about and surround a sputtering surface of the target. The annular band comprises a top wall having a first width, a bottom wall having a second width, and a support rim having a third width and extending radially outward from the top wall. A vertical trench is formed between an outer periphery of the bottom wall and a bottom contact surface of the support rim.

In yet another embodiment, a process kit for placement about a sputtering target and a substrate support in a substrate processing chamber is provided. The process kit comprises a shield encircling the sputtering target and a substrate support. The shield comprises a cylindrical outer band having a first diameter sized to encircle the sputtering surface of the sputtering target. The cylindrical outer band has a top end that surrounds the sputtering surface and a bottom end that surrounds the substrate support. A sloped step having a second diameter greater than the first diameter extends radially outward from the top end of the cylindrical outer band. A mounting flange extends radially outward from the sloped step. A base plate extends radially inward from the bottom end of the cylindrical band. A cylindrical inner band coupled with the base plate partially surrounds a peripheral edge of the substrate support. The process kit further comprises an isolator ring. The isolator ring comprises an annular band extending about and surrounds a sputtering surface of the target. The annular band comprises a top wall having a first width, a bottom wall having a second width, and a support rim having a third width and extending radially outward from the top wall. A vertical trench is formed between an outer periphery of the bottom wall and a bottom contact surface of the support rim.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5B is a side view of an embodiment of the one piece shield of FIG. 5A;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide a process kit for use in a physical deposition chamber (PVD) chamber. In one embodiment, the process kit provides a reduced RF return path contributing to a reduction in RF harmonics and stray plasma outside the process cavity, which promotes greater process uniformity and repeatability along with longer chamber component service life. In one embodiment, the process kit provides an isolator ring designed to reduce electrical shorts between the chamber walls and the target.

Figure 1:
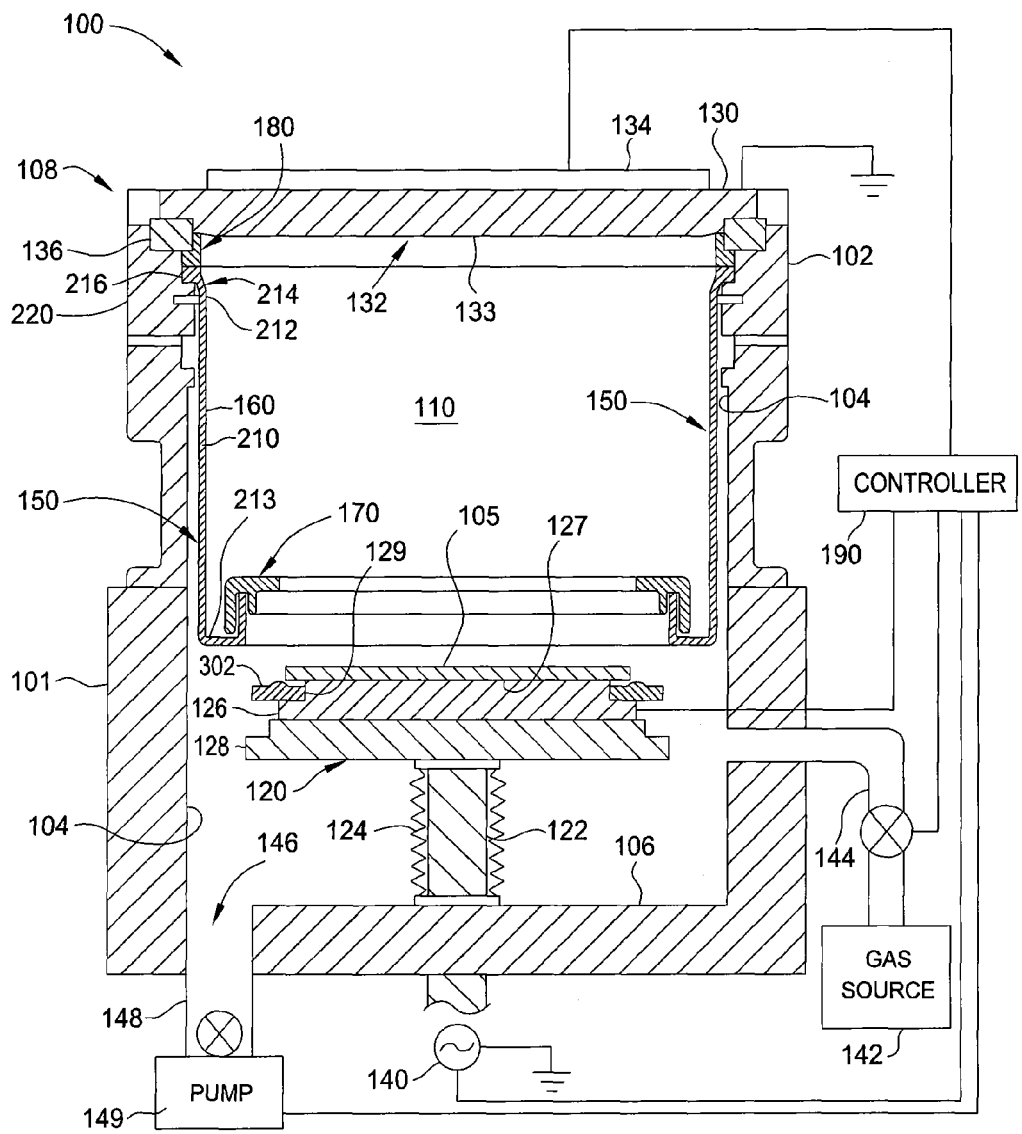
FIG. 1 is a simplified sectional view of a semiconductor processing system having one embodiment of a process kit.

FIG. 1 depicts an exemplary semiconductor processing chamber 100 having one embodiment of a process kit 150 capable of processing a substrate 105. The process kit 150 includes a one-piece ground shield 160, an interleaving cover ring 170, and an isolator ring 180. In the version shown, the processing chamber 100 comprises a sputtering chamber, also called a physical vapor deposition or PVD chamber, capable of depositing titanium or aluminum oxide on a substrate. The processing chamber 100 may also be used for other purposes, such as for example, to deposit aluminum, copper, tantalum, tantalum nitride, tantalum carbide, tungsten, tungsten nitride, lanthanum, lanthanum oxides, and titanium. One example of a processing chamber that may be adapted to benefit from the invention is the ALPS® Plus and SIP ENCORE® PVD processing chamber, available from Applied Materials, Inc. of Santa Clara, Calif. It is contemplated that other processing chambers including those from other manufacturers may be adapted to benefit from the invention.

The processing chamber 100 includes a chamber body 101 having enclosure walls 102 and sidewalls 104, a bottom wall 106, and a lid assembly 108 that enclose an interior volume 110 or plasma zone. The chamber body 101 is typically fabricated from welded plates of stainless steel or a unitary block of aluminum. In one embodiment, the sidewalls comprise aluminum and the bottom wall comprises stainless steel. The sidewalls 104 generally contain a slit valve (not shown) to provide for entry and egress of a substrate 105 from the processing chamber 100. The lid assembly 108 of the processing chamber 100 in cooperation with the ground shield 160 that interleaves with the cover ring 170 confines a plasma formed in the interior volume 110 to the region above the substrate.

A pedestal assembly 120 is supported from the bottom wall 106 of the chamber 100. The pedestal assembly 120 supports a deposition ring 302 along with the substrate 105 during processing. The pedestal assembly 120 is coupled to the bottom wall 106 of the chamber 100 by a lift mechanism 122 that is configured to move the pedestal assembly 120 between an upper and lower position. Additionally, in the lower position, lift pins are moved through the pedestal assembly 120 to space the substrate from the pedestal assembly 120 to facilitate exchange of the substrate with a wafer transfer mechanism disposed exterior to the processing chamber 100, such as a single blade robot (not shown). A bellows 124 is typically disposed between the pedestal assembly 120 and the chamber bottom wall 106 to isolate the interior volume 110 of the chamber body 101 from the interior of the pedestal assembly 120 and the exterior of the chamber.

The pedestal assembly 120 generally includes a substrate support 126 sealingly coupled to a platform housing 128. The platform housing 128 is typically fabricated from a metallic material such as stainless steel or aluminum. A cooling plate (not shown) is generally disposed within the platform housing 128 to thermally regulate the substrate support 126. One pedestal assembly 120 that may be adapted to benefit from the embodiments described herein is described in U.S. Pat. No. 5,507,499, issued Apr. 16, 1996 to Davenport et al., which is incorporated herein by reference in its entirety.

The substrate support 126 may be comprised of aluminum or ceramic. The substrate support 126 has a substrate receiving surface 127 that receives and supports the substrate 105 during processing, the surface 127 having a plane substantially parallel to a sputtering surface 133 of the target 132. The support 126 also has a peripheral edge 129 that terminates before an overhanging edge of the substrate 105. The substrate support 126 may be an electrostatic chuck, a ceramic body, a heater or a combination thereof. In one embodiment, the substrate support 126 is an electrostatic chuck that includes a dielectric body having a conductive layer embedded therein. The dielectric body is typically fabricated from a high thermal conductivity dielectric material such as pyrolytic boron nitride, aluminum nitride, silicon nitride, alumina or an equivalent material.

The lid assembly 108 generally includes a lid 130, a target 132, and a magnetron 134. The lid 130 is supported by the sidewalls 104 when in a closed position, as shown in FIG. 1. A ceramic ring seal 136 is disposed between the isolator ring 180 and the lid 130 and sidewalls 104 to prevent vacuum leakage therebetween.

The target 132 is coupled to the lid 130 and exposed to the interior volume 110 of the processing chamber 100. The target 132 provides material which is deposited on the substrate during a PVD process. The isolator ring 180 is disposed between the target 132, lid 130, and chamber body 101 to electrically isolate the target 132 from the lid 130 and the chamber body 101.

The target 132 is biased relative to ground, e.g. the chamber body 101 and adapters 220, by a power source 140. A gas, such as argon, is supplied to the interior volume 110 from a gas source 142 via conduits 144. The gas source 142 may comprise a non-reactive gas such as argon or xenon, which is capable of energetically impinging upon and sputtering material from the target 132. The gas source 142 may also include a reactive gas, such as one or more of an oxygen-containing gas, a nitrogen-containing gas, a methane-containing gas, that are capable of reacting with the sputtering material to form a layer on a substrate. Spent process gas and byproducts are exhausted from the chamber 100 through exhaust ports 146 that receive spent process gas and direct the spent process gas to an exhaust conduit 148 having a throttle valve to control the pressure of the gas in the chamber 100. The exhaust conduit 148 is connected to one or more exhaust pumps 149. Typically, the pressure of the sputtering gas in the chamber 100 is set to sub-atmospheric levels, such as a vacuum environment, for example, gas pressures of 0.6 mTorr to 400 mTorr. A plasma is formed between the substrate 105 and the target 132 from the gas. Ions within the plasma are accelerated toward the target 132 and cause material to become dislodged from the target 132. The dislodged target material is deposited on the substrate.

The magnetron 134 is coupled to the lid 130 on the exterior of the processing chamber 100. One magnetron which may be utilized is described in U.S. Pat. No. 5,953,827, issued Sep. 21, 1999 to Or et al., which is hereby incorporated by reference in its entirety.

The chamber 100 is controlled by a controller 190 that comprises program code having instruction sets to operate components of the chamber 100 to process substrates in the chamber 100. For example, the controller 190 can comprise program code that includes a substrate positioning instruction set to operate the pedestal assembly 120; a gas flow control instruction set to operate gas flow control valves to set a flow of sputtering gas to the chamber 100; a gas pressure control instruction set to operate a throttle valve to maintain a pressure in the chamber 100; a temperature control instruction set to control a temperature control system (not shown) in the pedestal assembly 120 or sidewall 104 to set temperatures of the substrate or sidewalls 104, respectively; and a process monitoring instruction set to monitor the process in the chamber 100.

The chamber 100 also contains a process kit 150 which comprises various components that can be easily removed from the chamber 100, for example, to clean sputtering deposits off the component surfaces, replace or repair eroded components, or to adapt the chamber 100 for other processes. In one embodiment, the process kit 150 comprises an isolator 180, a ground shield 160 and a ring assembly 168 for placement about a peripheral edge 129 of the substrate support 126 that terminates before an overhanging edge of the substrate 105.

The shield 160 encircles the sputtering surface 133 of a sputtering target 132 that faces the substrate support 126 and the peripheral edge 129 of the substrate support 126. The shield 160 covers and shadows the sidewalls 104 of the chamber 100 to reduce deposition of sputtering deposits originating from the sputtering surface 133 of the sputtering target 132 onto the components and surfaces behind the shield 160. For example, the shield 160 can protect the surfaces of the support 126, the overhanging edge of the substrate 105, sidewalls 104 and bottom wall 106 of the chamber 100.

As shown in FIGS. 1, 5A, 5B, 5C, and 5D, the shield 160 is of unitary construction and comprises a cylindrical outer band 210 having a diameter dimensioned to encircle the sputtering surface 133 of the sputtering target 132 and the substrate support 126. In one embodiment, the cylindrical outer band 210 has an inner diameter represented by arrows "A". In one embodiment, the inner diameter "A" of the cylindrical outer band 210 is between about 16 inches (40.6 cm) and about 18 inches (45.7 cm). In another embodiment, the inner diameter "A" of the cylindrical outer band 210 is between about 16.8 inches (42.7 cm) and about 17 inches (43.2 cm). In one embodiment, the cylindrical outer band 210 has an outer diameter represented by arrows "B". In one embodiment, the outer diameter "B" of the cylindrical outer band 210 is between about 17 inches (43.2 cm) and about 19 inches (48.3 cm). In another embodiment, the outer diameter "B" of the cylindrical outer band 210 is between about 17.1 inches (43.4 cm) and about 17.3 inches (43.9 cm).

The cylindrical outer band 210 has a top end 212 that surrounds the sputtering surface 133 of the sputtering target 132 and a bottom end 213 that surrounds the substrate support 126. A sloped step 214 extends radially outward from the top end 212 of the cylindrical outer band 210. In one embodiment, the sloped step 214 forms an angle "α" relative to vertical. In one embodiment, the angle "α" is from between about 15 degrees to about 25 degrees from vertical. In another embodiment, the sloped angle "α" is about 20 degrees.

In one embodiment, the shield 160 has a height "C" between about 10 inches and about 12 inches. In another embodiment, the shield 160 has a height "C" between about 11 inches (27.9 cm) and 11.5 inches (29.2 cm). In yet another embodiment, the shield 160 has a height "C" between about 7 inches (17.8 cm) and about 8 inches (20.3 cm). In yet another embodiment, the shield has a height "C" between about 7.2 inches (18.3 cm) and about 7.4 (18.8 cm).

Figure 2:
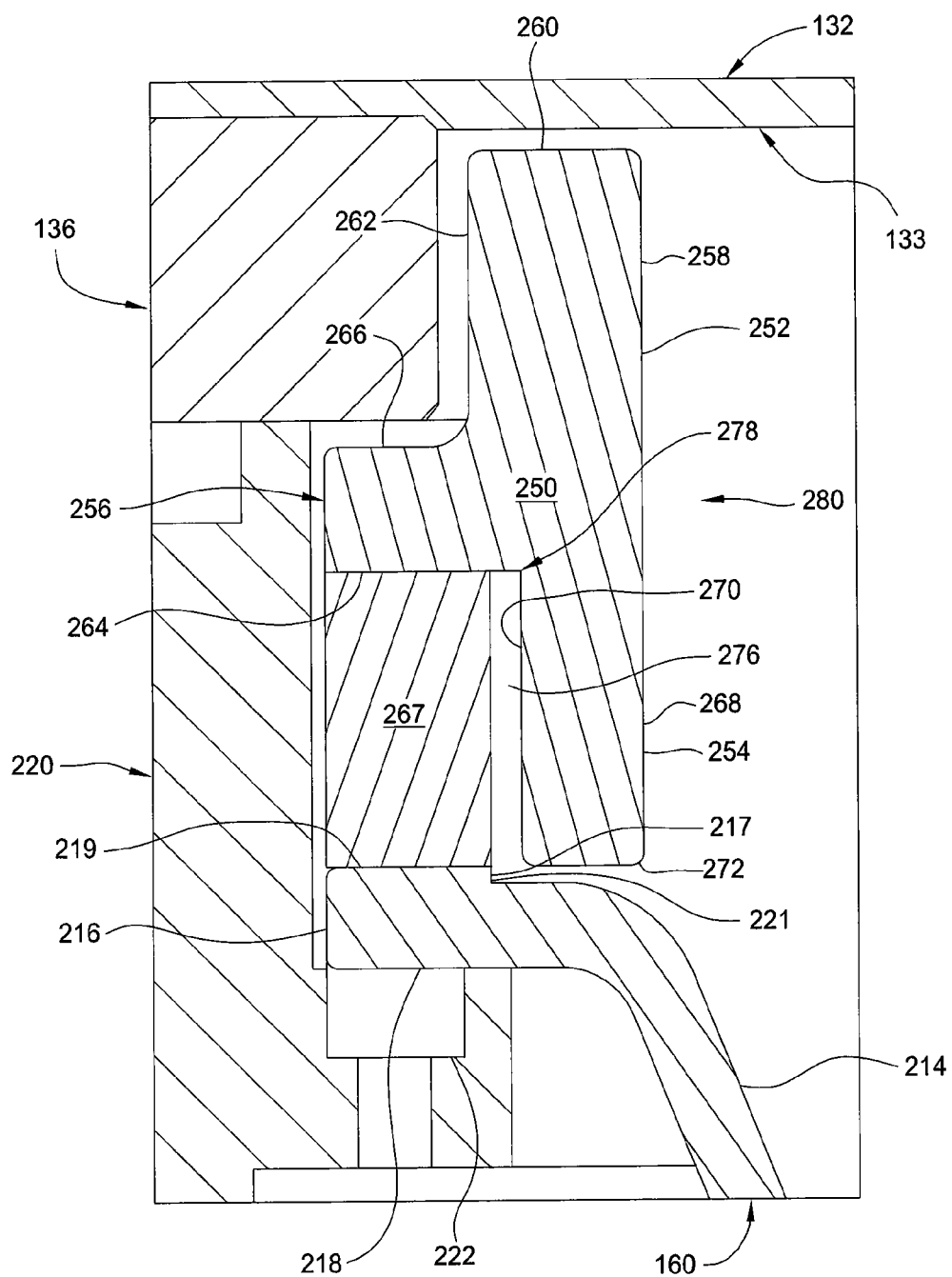
FIG. 2 is a partial sectional view of one embodiment of a process kit interfaced with a target and adapter of FIG. 1.
Figure 5A:
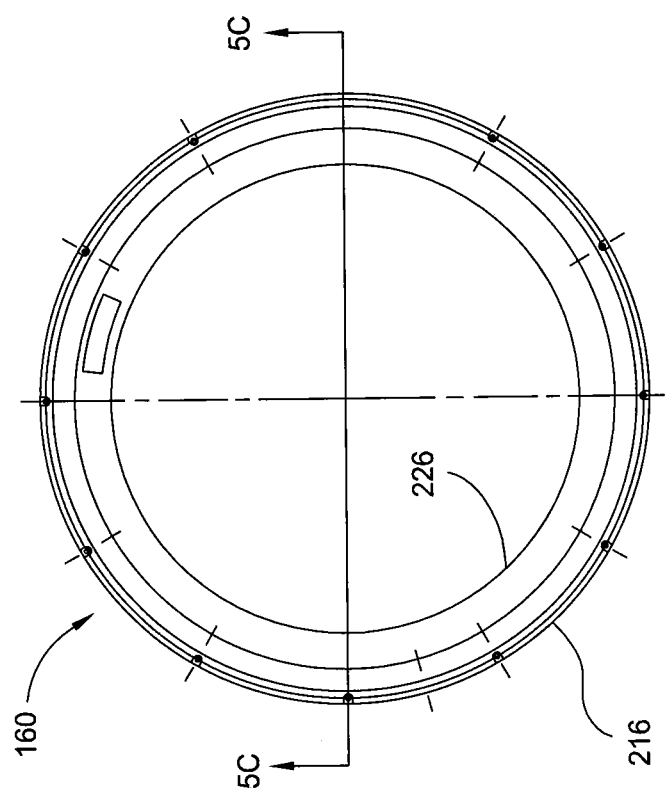
FIG. 5A is a top view of a one piece shield according to an embodiment described herein.
Figure 5C:
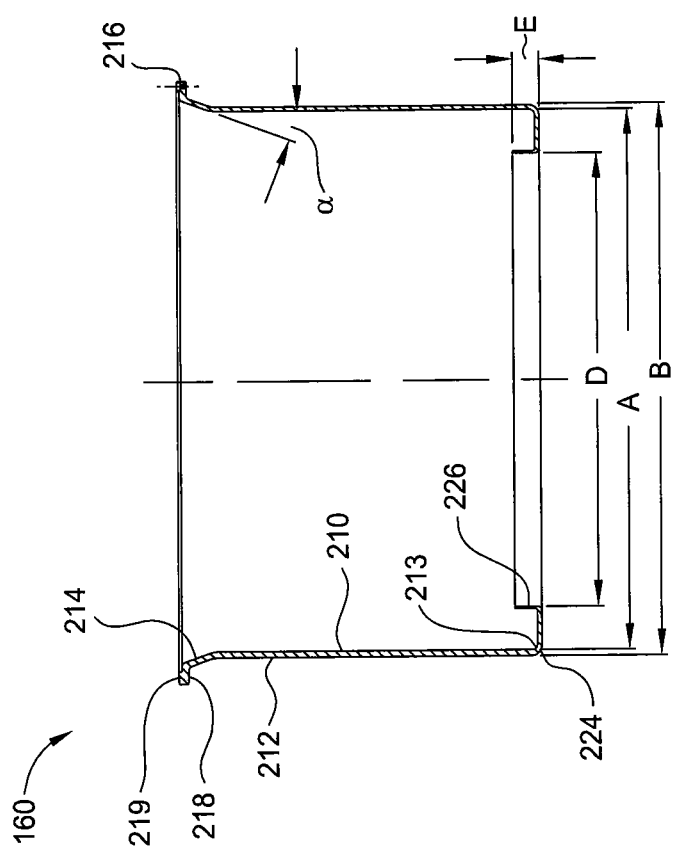
FIG. 5C is a cross-section view of one embodiment of the one piece shield of FIG. 5A.
Figure 5D:
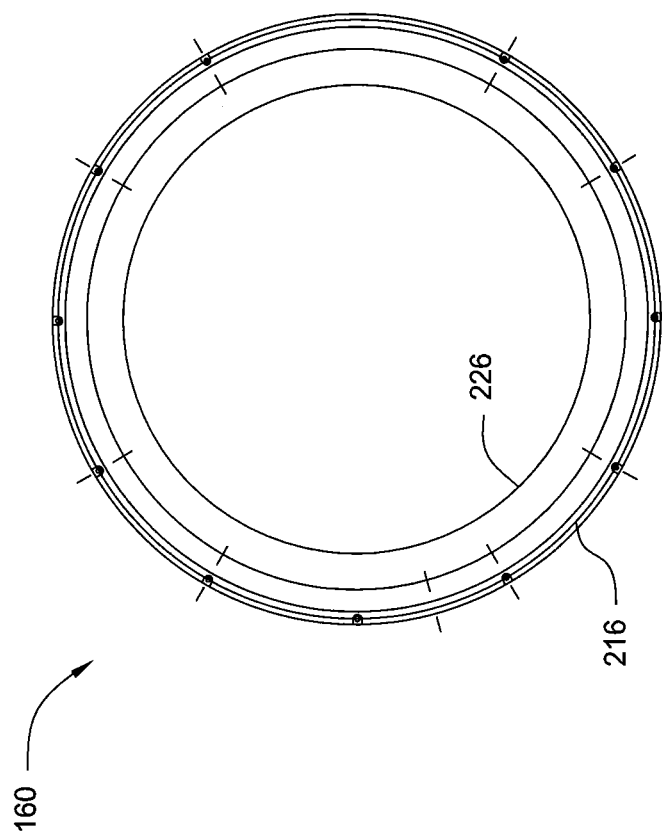
FIG. 5D is a bottom view of one embodiment of the one piece shield of FIG. 5A.
Figure 6A:
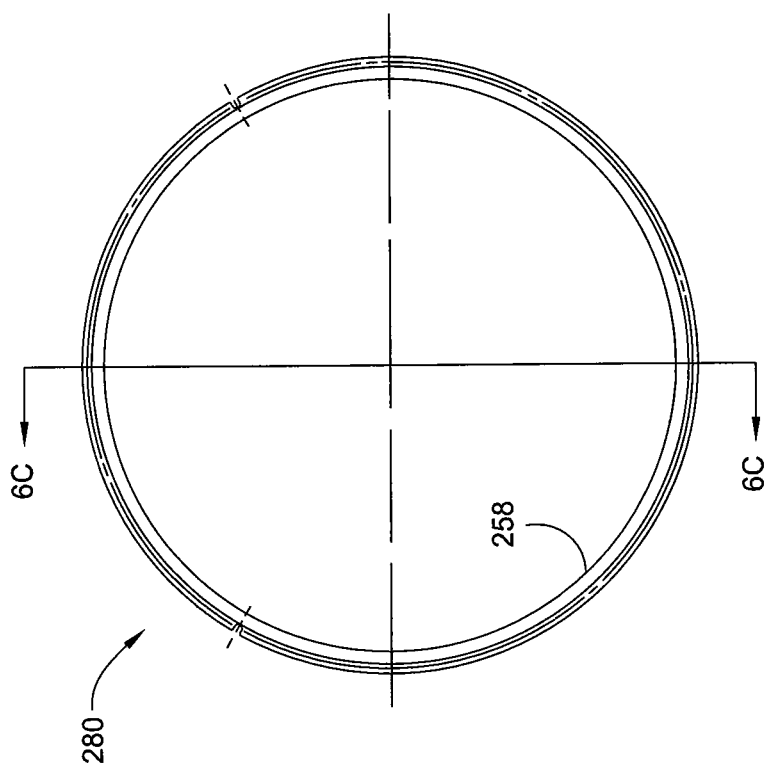
FIG. 6A is a top view of an insulator ring according to an embodiment described herein.
Figure 6B:
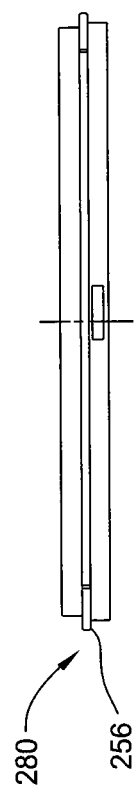
FIG. 6B is a side view of one embodiment of the insulator ring of FIG. 6A.
Figure 6C:
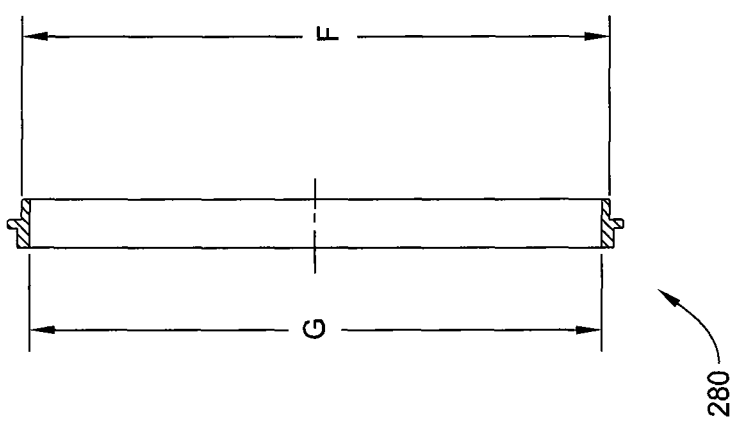
FIG. 6C is a cross-section view of one embodiment of the insulator ring of FIG. 6A.
Figure 6D:
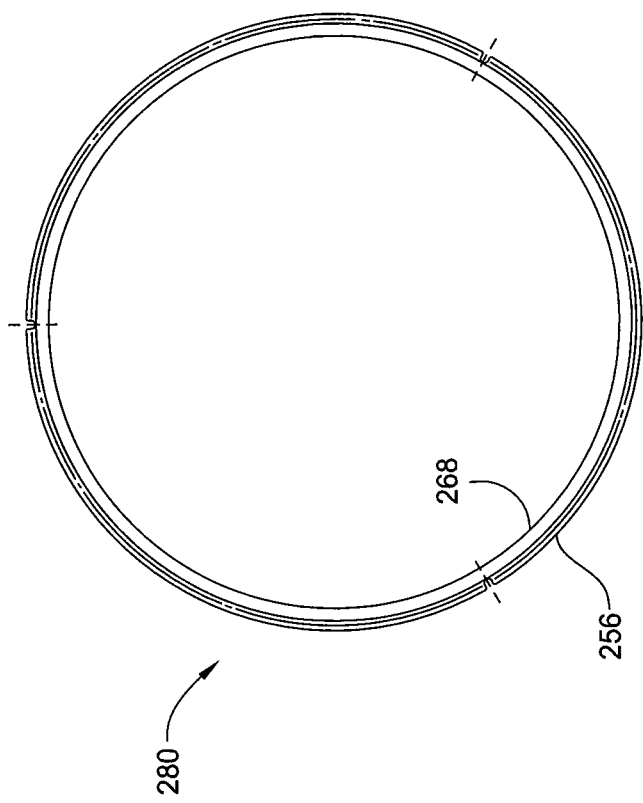
FIG. 6D is a bottom view of one embodiment of the insulator ring of FIG. 6A.

A mounting flange 216 extends radially outward from the sloped step 214 of the cylindrical outer band 210. Referring to FIG. 2 and FIG. 5C, the mounting flange 216 comprises a lower contact surface 218 to rest upon an annular adapter 220 surrounding the sidewalls 104 of the chamber 100 and an upper contact surface 219. In one embodiment, the lower contact surface 218 of the mounting flange 216 comprises a plurality of counterbores (not shown) shaped and sized to receive a screw to affix the shield 160 to the adapter 220. As shown in FIG. 2, an inner periphery 217 of the upper contact surface 219 forms a step 221. The step 221 provides a labyrinth gap that prevents conductive material from creating a surface bridge between the isolator ring 180 and the shield 160, thus maintaining electrical discontinuity.

In one embodiment, the adapter 220 supports the shield 160 and can serve as a heat exchanger about the sidewall 104 of the substrate processing chamber 100. The adapter 220 and the shield 160 form an assembly that allows improved heat transfer from the shield 160 and which reduces thermal expansion stresses on the material deposited on the shield. Portions of the shield 160 can become excessively heated by exposure to the plasma formed in the substrate processing chamber 100, resulting in thermal expansion of the shield and causing sputtering deposits formed on the shield to flake off from the shield and fall upon and contaminate the substrate 105. The adapter 220 has a resting surface 222 that contacts the lower contact surface 218 of the shield 160 to allow good electrical and thermal conductivity between the shield 160 and the adapter 220. In one embodiment, the adapter 220 further comprises conduits for flowing a heat transfer fluid therethrough to control the temperature of the adapter 220.

Referring to FIGS. 1, 4, 5A, 5B, 5C, and 5D, the cylindrical outer band 210 also comprises a bottom end 213 that surrounds the substrate support 126. A base plate 224 extends radially inward from the bottom end 213 of the cylindrical outer band 210. A cylindrical inner band 226 is coupled with the base plate 224 and at least partially surrounding the peripheral edge 129 of the substrate support 126. In one embodiment, the cylindrical inner band has a diameter represented by arrows "D". In one embodiment, the cylindrical inner band 226 has a diameter "D" between about 14 inches (35.6 cm) and about 16 inches (40.6 cm). In another embodiment, the cylindrical inner band 226 has a diameter "D" between about 14.5 inches (36.8 cm) and about 15 inches (38.1 cm). The cylindrical inner band 226 extends upward from and is perpendicular to the base plate 224. The cylindrical inner band 226, the base plate 224, and the cylindrical outer band 210 form a U-shaped channel. The cylindrical inner band 226 comprises a height that is less than the height of the cylindrical outer band 210. In one embodiment, the height of the inner band 226 is about one fifth of the height of the cylindrical outer band 210. In one embodiment, the cylindrical inner band 226 has a height represented by arrows "E". In one embodiment, the height "E" of the cylindrical inner band 226 is from about 0.8 inches (2 cm) to about 1.3 inches (3.3 cm). In another embodiment, the height "E" of the cylindrical inner band 226 is from about 1.1 inches (2.8 cm) to about 1.3 inches (3.3 cm). In another embodiment, the height of the cylindrical inner band 226 is from about 0.8 inches (2 cm) to about 0.9 inches (2.3 cm).

The cylindrical outer band 210, the sloped step 214, the mounting flange 216, the base plate 224, and the cylindrical inner band 226 comprise a unitary structure. For example, in one embodiment, the entire shield 160 can be made from aluminum or in another embodiment, 300 series stainless steel. A unitary shield 160 is advantageous over prior shields which included multiple components, often two or three separate pieces to make up the complete shield. In comparison with existing multiple part shields, which provide an extended RF return path contributing to RF harmonics causing stray plasma outside the process cavity, the unitary shield reduces the RF return path thus providing improved plasma containment in the interior processing region. A shield 160 with multiple components makes it more difficult and laborious to remove the shield for cleaning. The single piece shield 160 has a continuous surface exposed to the sputtering deposits without interfaces or corners that are more difficult to clean out. The single piece shield 160 also more effectively shields the chamber walls 104 from sputter deposition during process cycles. In one embodiment, conductance features, such as conductance holes, are eliminated. The elimination of conductance features reduces the formation of stray plasmas outside of the interior volume 110.

In one embodiment, the exposed surfaces of the shield 160 are treated with CLEANCOAT™, which is commercially available from Applied Materials, Santa Clara, Calif. CLEANCOAT™ is a twin-wire aluminum arc spray coating that is applied to substrate processing chamber components, such as the shield 160, to reduce particle shedding of deposits on the shield 160 and thus prevent contamination of a substrate 105 in the chamber 100. In one embodiment, the twin-wire aluminum arc spray coating on the shield 160 has a surface roughness of from about 600 to about 2300 microinches.

The shield 160 has exposed surfaces facing the interior volume 110 in the chamber 100. In one embodiment, the exposed surfaces are bead blasted to have a surface roughness of 175±75 microinches. The texturized bead blasted surfaces serve to reduce particle shedding and prevent contamination within the chamber 100. The surface roughness average is the mean of the absolute values of the displacements from the mean line of the peaks and valleys of the roughness features along the exposed surface. The roughness average, skewness, or other properties may be determined by a profilometer that passes a needle over the exposed surface and generates a trace of the fluctuations of the height of the asperities on the surface, or by a scanning electron microscope that uses an electron beam reflected from the surface to generate an image of the surface.

Figure 3:
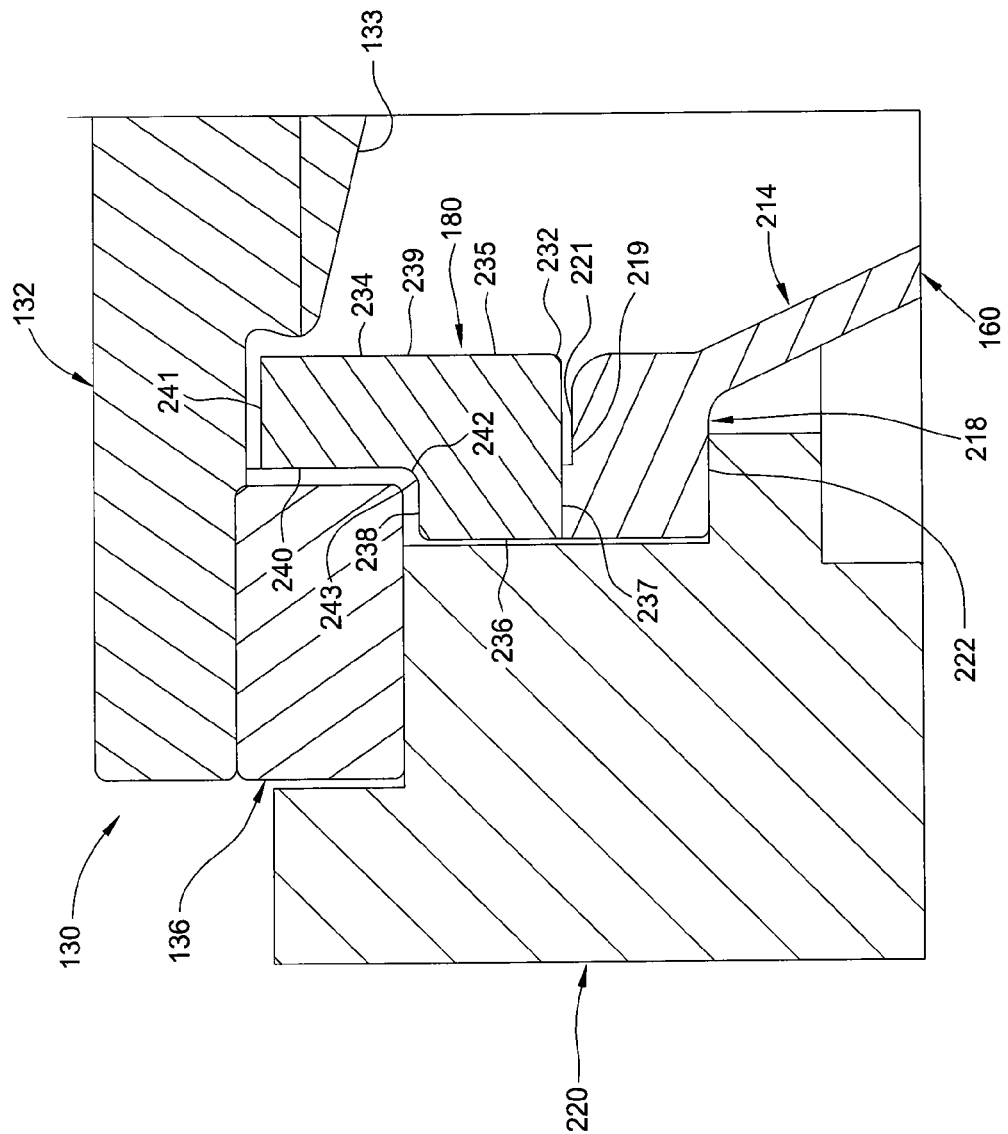
FIG. 3 is a partial sectional view of one embodiment of a process kit interfaced with a target and adapter of FIG. 1.

Referring to FIG. 3, in one embodiment, the isolator ring 180 is L-shaped. The isolator ring 180 comprises an annular band that extends about and surrounds the sputtering surface 133 of the target 132. The isolator ring 180 electrically isolates and separates the target 132 from the shield 160 and is typically formed from a dielectric or insulative material such as aluminum oxide. The isolator ring 180 comprises a lower horizontal portion 232 and a vertical portion 234 extending upward from the lower horizontal portion 232. The lower horizontal portion 232 comprises an inner periphery 235, an outer periphery 236, a bottom contact surface 237, and top surface 238, wherein the bottom contact surface 237 of the lower horizontal portion 232 contacts an upper contact surface 219 of the mounting flange 216. In one embodiment the upper contact surface 219 of the shield 160 forms a step 221. The step 221 provides a labyrinth gap that prevents conductive material from creating a surface bridge between the isolator ring 180 and the shield 160, thus maintaining electrical discontinuity. The upper vertical portion 234 of the isolator ring 180 comprises an inner periphery 239, an outer periphery 240, and a top surface 241. The inner periphery 239 of the upper vertical portion 234 and the inner periphery 235 of the lower horizontal portion 232 form a unitary surface. The top surface 238 of the lower horizontal portion 232 and the outer periphery 240 of the upper vertical portion 234 intersect at a transition point 242 to form a step 243. In one embodiment, the step 243 forms a labyrinth gap with the ring seal 136 and target 132.

In one embodiment, the isolator ring 180 has an inner diameter, defined by inner periphery 235 and inner periphery 239, between about 17.5 inches (44.5 cm) and about 18 inches (45.7 cm). In another embodiment, the isolator ring 180 has an inner diameter between about 17.5 inches (44.5 cm) and 17.7 inches (45 cm). In one embodiment, the isolator ring 180 has an outer diameter, defined by the outer periphery 236 of the lower horizontal portion 232, between about 18 inches (45.7 cm) and about 19 inches (48.3 cm). In another embodiment, the isolator ring 180 has an outer diameter between about 18.7 inches (47.5 cm) and about 19 inches (48.3 cm). In another embodiment, the isolator ring 180 has a second outer diameter, defined by the outer periphery 240 of the upper vertical portion 234, between about 18 inches (45.7 cm) and about 18.5 inches (47 cm). In another embodiment, the second outer diameter is between about 18.2 inches (46.2 cm) and about 18.4 inches (46.7 cm). In one embodiment, the isolator ring 180 has a height between about 1 inch (2.5 cm) and about 1.5 inches (3.8 cm). In another embodiment, the isolator ring 180 has a height between about 1.4 inches (3.6 cm) and about 1.45 inches (3.7 cm).

In one embodiment, the exposed surfaces, including the top surface 241 and inner periphery of the vertical portion 234, the inner periphery 235 and bottom contact surface 237 of the lower horizontal portion 232 of the isolator 180 are textured using for example, grit blasting, with a surface roughness of 180±20 Ra, which provides a suitable texture for low deposition and lower stress films.

With reference to FIGS. 2, 6A, 6B, 6C, and 6D in another embodiment, the isolator ring 280 is T-shaped. The isolator ring 280 comprises an annular band 250 that extends about and surrounds the sputtering surface 133 of the target 132. The annular band 250 of the isolator ring 280 comprises a top wall 252 having a first width, a bottom wall 254 having a second width, and a support rim 256, having a third width, extending radially outward from the top wall 252 of the annular band 250. In one embodiment, the first width is less than the third width but greater than the second width. In one embodiment, the isolator ring 280 has an outer diameter "F" of between about 18.5 inches (47 cm) and about 19 inches (48.3 cm). In another embodiment, the isolator ring 280 has an outer diameter "F" of between about 18.8 inches (47.8 cm) and about 18.9 inches (48 cm).

The top wall 252 comprises an inner periphery 258, a top surface 260 positioned adjacent to the target 132, and an outer periphery 262 positioned adjacent to the ring seal 136. The support rim 256 comprises a bottom contact surface 264 and an upper surface 266. The bottom contact surface 264 of the support rim 256 rests on an aluminum ring 267. In certain embodiments, the aluminum ring 267 is not present and the adapter 220 is configured to support the support rim 256. The bottom wall 254 comprises an inner periphery 268, an outer periphery 270, and a bottom surface 272. The inner periphery 268 of the bottom wall 254 and the inner periphery 258 of the top wall 252 form a unitary surface. In one embodiment, the isolator ring 280 has an inner diameter "G", defined by the inner periphery 268 of the bottom wall 254 and the inner periphery 258 of the top wall 252, between about 17 inches (43.2 cm) and about 18 inches (45.7 cm). In another embodiment, the inner diameter "G" of the isolator ring 280 is between about 17.5 inches (44.5 cm) and about 17.8 inches (45.2 cm).

A vertical trench 276 is formed at a transition point 278 between the outer periphery 270 of the bottom wall 254 and the bottom contact surface 264 of the support rim 256. The step 221 of the shield 160 in combination with the vertical trench 276 provides a labyrinth gap that prevents conductive material from creating a surface bridge between the isolator ring 280 and the shield 160, thus maintaining electrical discontinuity while still providing shielding to the chamber walls 104. In one embodiment, the isolator ring 280 provides a gap between the target 132 and the ground components of the process kit 150 while still providing shielding to the chamber walls. In one embodiment, the gap between the target 132 and the shield 160 is between about 1 inch (2.5 cm) and about 2 inches (5.1 cm), for example, about 1 inch (2.5 cm). In another embodiment, the gap between the target 132 and the shield 160 is between about 1.1 inches (2.8 cm) and about 1.2 inches (3 cm). In yet another embodiment the gap between the target 132 and the shield 160 is greater than 1 inch (2.5 cm). The stepped design of the isolator ring 280 allows for the shield 160 to be centered with respect to the adapter 220, which is also the mounting point for the mating shields and the alignment features for the target 132. The stepped design also eliminates line-of-site from the target 132 to the shield 160, eliminating stray plasma concerns in this area.

In one embodiment, the isolator ring 280 has a grit-blasted surface texture for enhanced film adherence with a surface roughness of 180±20 Ra, which provides a suitable texture for low deposition and lower stress films. In one embodiment, the isolator ring 280 has a surface texture provided through laser pulsing for enhanced film adherence with a surface roughness of >500 Ra for a higher deposition thickness and higher film stress. In one embodiment, the textured surfaces extend the lifetime of the isolator ring 280 when the processing chamber 100 is used to deposit metals, metal nitrides, metal oxides, and metal carbides. The isolator ring 280 is also removable from the chamber 100 providing the ability to recycle the part without impact on material porosity that would prevent reuse in a vacuum seal application. The support rim 256 allows for the isolator ring 280 to be centered with respect to the adapter 220 while eliminating the line-of-site from the target 132 to the ground shield 160 thus eliminating stray plasma concerns. In one embodiment the ring 267 comprises a series of alignment pins (not shown) that locate/align with a series of slots (not shown) in the shield 160.

Figure 4:
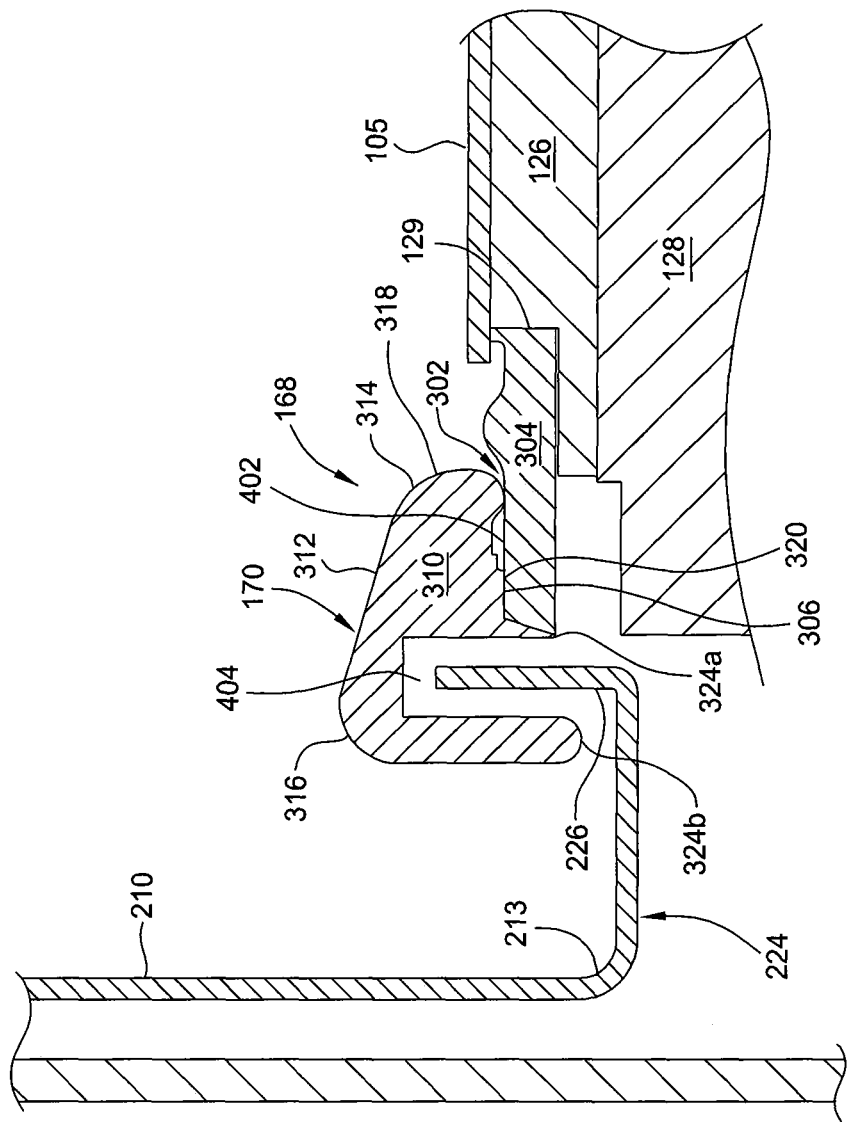
FIG. 4 is a partial sectional view of one embodiment of a process kit interfaced with the processing system of FIG. 1.

Referring to FIG. 4, the ring assembly 168 comprises a deposition ring 302 and a cover ring 170. The deposition ring 302 comprises an annular band 304 surrounding the support 126. The cover ring 170 at least partially covers the deposition ring 302. The deposition ring 302 and the cover ring 170 cooperate with one another to reduce formation of sputter deposits on the peripheral edges 129 of the support 126 and the overhanging edge of the substrate 105.

The cover ring 170 encircles and at least partially covers the deposition ring 302 to receive, and thus, shadow the deposition ring 302 from the bulk of the sputtering deposits. The cover ring 170 is fabricated from a material that can resist erosion by the sputtering plasma, for example, a metallic material such as stainless steel, titanium or aluminum, or a ceramic material, such as aluminum oxide. In one embodiment, the cover ring 170 is composed of titanium having a purity of at least about 99.9 percent. In one embodiment, a surface of the cover ring 170 is treated with a twin-wire aluminum arc-spray coating, such as, for example, CLEAN-COAT™, to reduce particle shedding from the surface of the cover ring 170.

The cover ring 170 comprises an annular wedge 310 comprising an inclined top surface 312 that is sloped radially inwards and encircles the substrate support 126. The inclined top surface 312 of the annular wedge 310 has an inner periphery 314 and an outer periphery 316. The inner periphery 314 comprises a projecting brim 318 which overlies the radially inward dip comprising an open inner channel of the deposition ring 302. The projecting brim 318 reduces deposition of sputtering deposits on the open inner channel of the deposition ring 302. In one embodiment, the projecting brim 318 projects a distance corresponding to at least about half the width of an arc-shaped gap 402 formed with the deposition ring 302. The projecting brim 318 is sized, shaped, and positioned to cooperate with and complement the arc-shaped gap 402 to form a convoluted and constricted flow path between the cover ring 170 and deposition ring 302 that inhibits the flow of process deposits onto the substrate support 126 and the platform housing 128. The constricted flow path of the gap 402 restricts the build-up of low-energy sputter deposits on the mating surfaces of the deposition ring 302 and the cover ring 170, which would otherwise cause them to stick to one another or to the peripheral overhanging edge of the substrate 105.

The inclined top surface 312 may be inclined at an angle of between about 10 degrees and about 20 degrees, for example, about 16 degrees from horizontal. The angle of the inclined top surface 312 of the cover ring 170 is designed to minimize the buildup of sputter deposits nearest to the overhanging edge of the substrate 105, which would otherwise negatively impact the particle performance obtained across the substrate 105.

The cover ring 170 comprises a footing 320 extending downward from the inclined top surface 312 of the annular wedge 310, to rest upon a ledge 306 of the deposition ring 302. The footing 320 extends downwardly from the wedge 310 to press against the deposition ring 302 substantially without cracking or fracturing the ring 302. In one embodiment, a dual-stepped surface is formed between the footing 320 and a lower surface of the projecting brim 318.

The cover ring 170 further comprises an inner cylindrical band 324a and an outer cylindrical band 324b that extend downwardly from the annular wedge 310, with a gap therebetween. In one embodiment, the inner cylindrical band 324a and the outer cylindrical band 324b are substantially vertical. The inner and outer cylindrical bands 324a and 324b are located radially outward of the footing 320 of the annular wedge 310. The inner cylindrical band 324a has a height that is smaller than the outer cylindrical band 324b. Typically, the height of the outer cylindrical band 324b is at least about 1.2 times the height of the inner cylindrical band 324a. For example, for a cover ring 170 having an inner radius of about 154 mm, the height of the outer cylindrical band 324b is from about 15 to about 35, or example, 25 mm; and the height of the inner cylindrical band 324a is from about 12 to about 24 mm, for example, about 19 mm. The cover ring may comprise any material that is compatible with process chemistries such as titanium or stainless steel.

In one embodiment, a surface of the inner cylindrical band 324a is angled between about 12 degrees and about 18 degrees from vertical. In another embodiment, the surface of the inner cylindrical band 324a is angled between about 15 degrees and about 17 degrees.

In one embodiment, the cover ring 170 has an outer diameter, defined by the outer cylindrical band 324b, between about 15.5 inches (39.4 cm) and about 16 inches (40.6 cm). In another embodiment, the cover ring 170 has an outer diameter between about 15.6 inches (39.6 cm) and about 15.8 inches (40.1 cm). In one embodiment, the cover ring 170 has a height between about 1 inch (2.5 cm) and about 1.5 inches (3.8 cm). In another embodiment, the cover ring 170 is between about 1.2 inches (3 cm) and about 1.3 inches (3.3 cm).

The space or gap 404 between the shield 160 and the cover ring 170 forms a convoluted S-shaped pathway or labyrinth for plasma to travel. The shape of the pathway is advantageous, for example, because it hinders and impedes ingress of plasma species into this region, reducing undesirable deposition of sputtered material.

The components of the process kit 150 described work alone and in combination to significantly reduce particle generation and stray plasmas. In comparison with existing multiple part shields, which provided an extended RF return path contributing to RF harmonics causing stray plasma outside the process cavity, the one piece shield described above reduces the RF return path thus providing improved plasma containment in the interior processing region. The flat baseplate of the one piece shield provides an additional shortened return path for RF through the pedestal to further reduce harmonics and stray plasma as well as providing a landing for existing grounding hardware. The one piece shield also eliminates all conductance features which provided discontinuities in RF return and led stray plasmas outside the process cavity. The one piece shield was modified to allow for insertion of an isolator ring into the process chamber. The isolator ring blocks the line of sight between the RF source and the process kit parts in the ground path. The mounting flange on the shield was modified to provide a step and large radius which provide a labyrinth that prevents conductive material deposition from creating a surface bridge between the isolator ring and the shield thus maintaining electrical discontinuity. The one piece shield is also designed for low-cost manufacturability through reducing materials thickness in order to allow for manufacturing through flow forming.

While the foregoing is directed to embodiments of the present invention, other and further embodiments of the invention may be devised without departing from the basic scope thereof, and the scope thereof is determined by the claims that follow.

The invention claimed is:

1. A cover ring for placement about a deposition ring in a substrate processing chamber, wherein the deposition ring is adapted to be positioned between a substrate support and a cylindrical shield in the chamber, the cover ring comprising:
   an annular wedge comprising:
      an inclined top surface sized to encircle the substrate support, the inclined top surface having an inner periphery and an outer periphery;
      a footing extending downward from the inclined top surface and configured to rest on the deposition ring; and
      a rounded projecting brim about the inner periphery of the inclined top surface, wherein a dual-stepped surface is formed by an arc-shaped gap opposite the inclined top surface between the footing and a lower surface of the projecting brim;
   an inner cylindrical band extending downward from the annular wedge; and
   an outer cylindrical band extending downward from the annular wedge, wherein the inner cylindrical band has a height smaller than a height of the outer cylindrical band, wherein the inner cylindrical band and the outer cylindrical band are located radially outward of the footing of the annular wedge and an outer periphery of the outer cylindrical band extends vertically upward to the outer periphery of the inclined top surface.

2. The covering ring of claim 1, wherein the cover ring comprises stainless steel.

3. The cover ring of claim 1 wherein the inclined top surface of the annular wedge slopes radially inward.

4. The cover ring of claim 1, wherein the inner cylindrical band and the outer cylindrical band are substantially vertical.

5. The cover ring of claim 1, comprising an exposed surface having a twin-wire aluminum arc spray coating.

6. The cover ring of claim 1, wherein the cover ring is fabricated from a metallic material selected from the group consisting of: titanium or aluminum.

7. The cover ring of claim 6, wherein the cover ring is fabricated from titanium having a purity of at least about 99.9%.

8. The cover ring of claim 1, wherein the projecting brim projects a distance corresponding to at least about half the width of the arc-shaped gap.

9. The cover ring of claim 1, wherein the inclined top surface is inclined at an angle of between about 10 degrees and about 20 degrees.

10. The cover ring of claim 1, wherein a surface of the inner cylindrical band that faces the deposition ring is angled between about 12 degrees and about 18 degrees from vertical.

* * * * *